United States Patent [19]

Baba et al.

[11] Patent Number: 4,559,492
[45] Date of Patent: Dec. 17, 1985

[54] APPARATUS FOR AUTOMATICALLY PHASE-CALIBRATING

[75] Inventors: Yasuo Baba; Ichiro Asano, both of Kyoto, Japan

[73] Assignee: Horiba, Ltd., Kyoto, Japan

[21] Appl. No.: 418,179

[22] Filed: Sep. 14, 1982

[30] Foreign Application Priority Data

Sep. 28, 1981 [JP] Japan ................................ 56-155352

[51] Int. Cl.⁴ .................. G01R 25/00; H03L 7/00; G04C 11/00
[52] U.S. Cl. .......................... 324/83 D; 324/83 FE; 328/155; 377/43
[58] Field of Search ............... 324/83 R, 83 D, 83 FE, 324/88, 121 R, 83 A; 307/511, 527; 328/155, 133; 377/43

[56] References Cited

U.S. PATENT DOCUMENTS

| | | | |
|---|---|---|---|
| 3,430,148 | 2/1969 | Miki | 328/155 |
| 3,441,342 | 4/1969 | Ball et al. | 328/155 |
| 3,557,308 | 1/1971 | Alexander et al. | 328/155 |
| 3,566,155 | 2/1971 | De Maio et al. | 328/155 |
| 3,578,956 | 5/1981 | McCall | 377/43 |
| 3,628,159 | 12/1971 | Ellis | 328/155 |
| 4,276,512 | 6/1981 | Wittke | 328/155 |
| 4,379,221 | 4/1983 | Avins et al. | 377/43 |
| 4,427,947 | 1/1984 | Suzuki et al. | 328/133 |

FOREIGN PATENT DOCUMENTS 2301964 9/1976 France .

Primary Examiner—Stewart J. Levy
Assistant Examiner—Stephen M. Baker
Attorney, Agent, or Firm—Wenderoth, Lind & Ponack

[57] ABSTRACT

A phase shift between two repeated square wave signals having equal frequency and duty is detected and detected phase shift is integrated during the appointed cycles of the square wave signals and the mean value per cycle is calculated from the integrated value, and a phase of one signal is overlapped on a phase of another signal automatically at the mean value. The same phase can be automatically given to two square wave signals having different phases.

5 Claims, 5 Drawing Figures

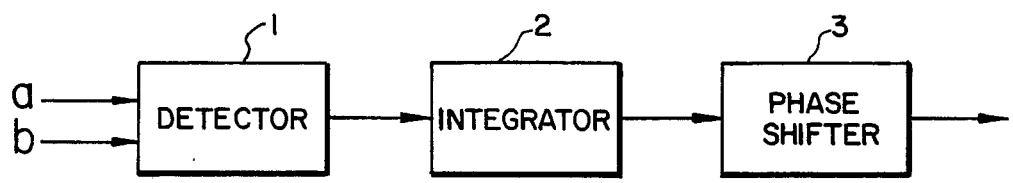
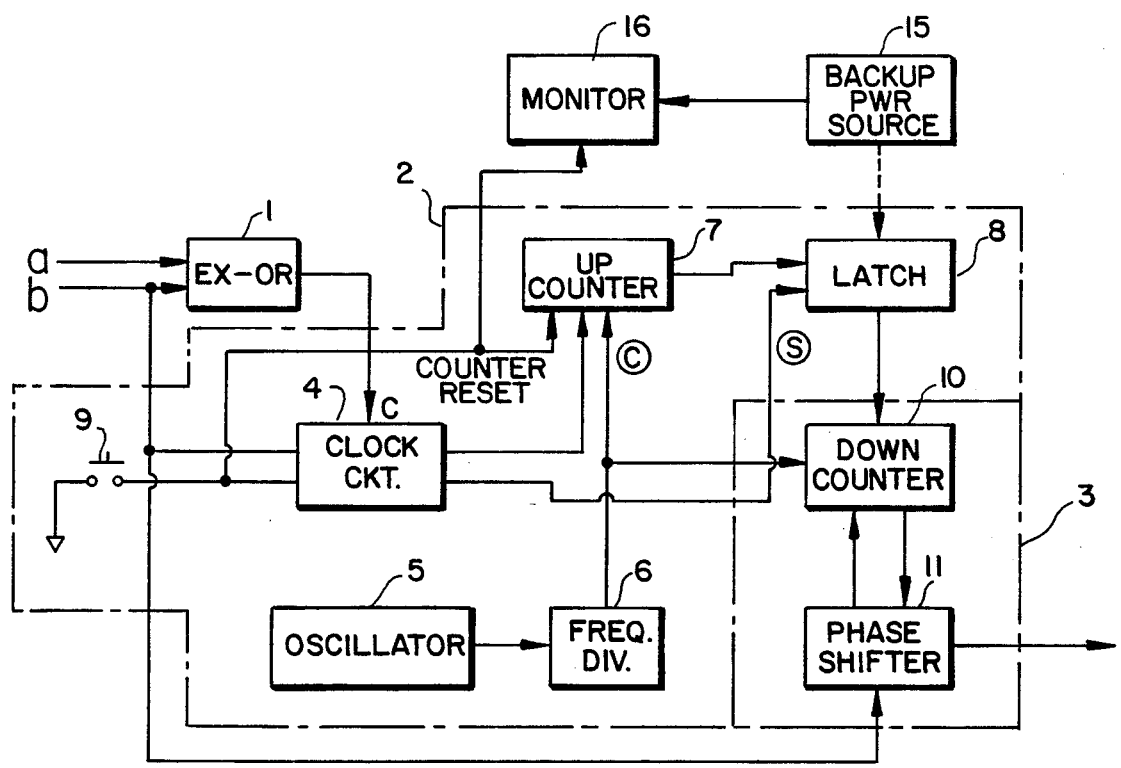

APPARATUS FOR AUTOMATICALLY PHASE-CALIBRATING

BACKGROUND OF THE INVENTION

1. Field of the Invention

The present invention relates to an apparatus for phase-calibrating so as to eliminate phase shifts developed between two repeated square wave signals having equal frequency and duty cycles by automatically overlapping a phase of one signal on a phase of another signal.

2. Description of the Prior Art

A circuit using two repeated signals having equal frequency and duty cycles includes for example a synchronous detector circuit. Phase shifts are developed between a signal to be detected, which is one signal, and a synchronized clock, which is another signal, in said synchronous detector circuit. There has been no such technique of overlapping phases of two signals in the field of synchronous detecting of low frequencies (1 to 10 Hz), and there have therefore been disadvantages such as a small absolute value of the output signal, an inferior S/N ratio and the like.

SUMMARY OF THE INVENTION

According to the present invention, the above described disadvantages can be eliminated by detecting phase shifts between two repeated square wave signals having equal frequency and duty cycles, and then integrating the detected phase shifts during the appointed cycles of said square wave signals, and then calculating the mean value per cycle from the resulting integral value, and automatically overlapping a phase of one signal on a phase of another signal at the calculated mean value.

BRIEF DESCRIPTION OF THE DRAWINGS

FIG. 1 is a block diagram showing the principle of the present invention.

FIG. 2 is a block diagram showing one of the preferred embodiments of the present invention as shown in FIG. 1.

DESCRIPTION OF THE PREFERRED EMBODIMENT

Figure 3:
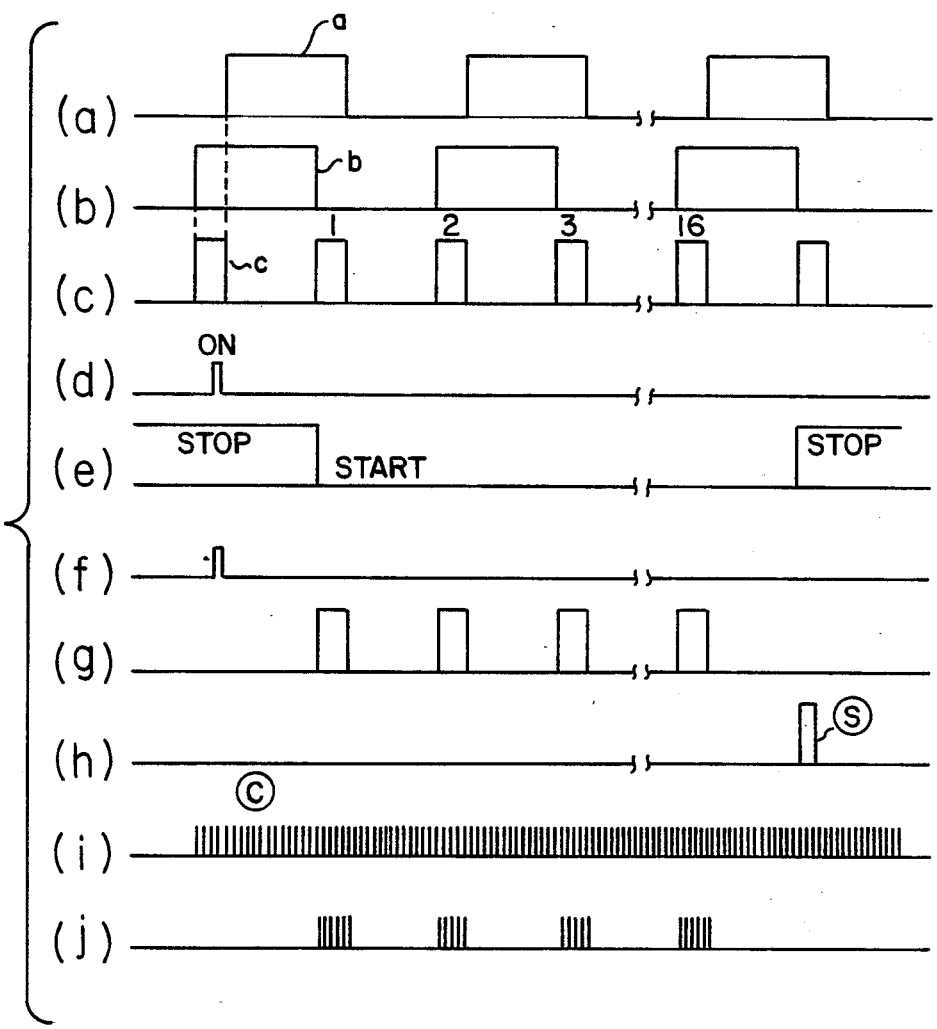
FIG. 3 is a diagram showing wave shapes of each part shown in FIG. 2.

An apparatus of the present invention will be described below by reference to the drawings.

Referring now to FIG. 1 which is a diagram showing the principle of an apparatus of the present invention, element 1 designates a detecting means for detecting phase shifts between two repeated square wave signals a and b having equal frequency and duty cycles. Element 2 designates a means for integrating said phase shifts detected by said detecting means 1 during the appointed cycles of said square wave signals and for calculating the mean value per cycle from the resulting integral value, and element 3 designates a means for phase-shifting a signal a or b by a phase shift equivalent to said mean value calculated by said means 2 to overlap a phase of said signal a or b on a phase of the other signal b or a. Although integration means 2 can be always operated by means of a negative feed-back circuit construction, it is generally desirable that said means integrating 2 is actuated only when an operator pushes a push button because the shifting of a phase of one signal by a wrong phase shift is preferably avoided since the correct phase shifts can not be detected if any one of said signals a and b is changed so as to be weaker than noise components. Consequently, the integrating means 2 is constructed so that a phase of one signal may be shifted merely wnen the signals of an amount larger than a predetermined value are input thereto.

The preferred embodiments of said means 1, 2, 3 are shown in FIG. 2. Said detecting means 1 is, for example, an exclusive "or" circuit. For example, a rectification signal to be synchronized and a synchronous clock can be selected as a signal a and a signal b to be fed to said exclusive "or" circuit. It is, however, necessary to transform said rectification signal to be synchronized into a square wave signal through a comparator and then feed it to said exclusive "or" circuit if said rectification signal to be synchronized is not a square wave signal. FIGS. 3(a)–(b) show the above described two square wave signals while FIG. 3(c) shows a detected signal output from said exclusive "or" circuit 1.

Said means 2 for integrating phase shifts and calculating the mean value is composed of, for example, a timing clock 4, an oscillator 5, a frequency divider 6, a counter 7 and a latch circuit 8. Said timing clock 4 is a circuit for adding said detected signal C to said counter 7 only during the appointed cycles of said square wave signals a and b. In the preferred embodiment, the operation-starting time of said circuit 4 can be controlled by means of a synchronizing push button 9. Said push button 9 is connected to said counter 7 also. The counted value, which has been stored in said counter 7, is reset when said push button 9 is pushed. FIG. 3(d) shows pushing times of said push button 9 and FIG. 3(e) shows start-stop signals fed from said timing clock 4 to said counter 7 by pushing said push button 9, and FIG. 3(f) showing reset signals directly fed to said counter 7 by pushing said push button 9. As shown in FIG. 3(e), said counter 7 starts to operate within a period from the resetting of the counted value by pushing said push button 9 to the application of the first detected signal C to said timing clock 4. On the other hand, said counter 7 is stopped at the time when the appointed cycles of said square wave signal a or b have passed. 16 cycles are selected for the appointed cycles in this preferred embodiment. Consequently, 16 detected signals C are fed to said counter 7 during the operation thereof, as shown in FIG. 3(g). In addition, said timing clock 4 generates a counterstopping signal and at the same time generates a latch-instructing signal $\text{Ⓢ}$ for said latch circuit 8 as shown in FIG. 3(h).

Said counter 7 is constructed so as to be able to count up only during a period when said signals Ⓒ are added thereto through said timing clock 4. Said counter 7 can count up clock signals Ⓒ, as shown in FIG. 3(i), which are fed thereto through said frequency divider 6 as shown in FIG. 3(j). It is noted that said clock signals Ⓒ have a definite constant frequency. Consequently, the number n of said divided clock signals Ⓒ counted by said counter 7 during a period until said counterstopping signal is applied to said counter 7 is the value equivalent to the sum total of the clock signals generated during the pulse widths of 16 signals C fed to said counter 7. This value is equivalent to the value of phase shifts between two square wave signals a and b integrated over 16 cycles. In this preferred embodiment, an up-counter of 12 bits is used for said counter 7 and pulses having a frequency of 1,024 Hz are used for said clock signals ©. The number of bits of said counter 7 is selected so that said clock signals © can be counted during 16 cycles even in case of the maximum phase shift, that is, when two square wave signals a and b have a frequency of 2 Hz and have a phase shift of 180°.

After said counter 7 has counted during 16 cycles, a latch-instructing signal is generated from said timing clock 4 when a counter-stopping signal is applied to said counter 7, and the counted value in said counter 7 is thereby transferred into said latch circuit 8. At this juncture, said counted value in said counter 7, which is the value of phase shifts integrated over 16 cycles, is transformed into a mean value per cycle by transferring to the latch circuit 8 only the counted value of the eight most significant bits of the counter 7 and not transferring the counted value of the 4 least significant bits. That is, the value latched in said latch circuit 8 is equivalent to a value equal to 1/16 times the counted value counted by said counter 7. Thus, the value latched in said latch circuit 8 is equal to a mean value per cycle since the counted value is the value of phase shifts integrated over 16 cycles. This is mathematically expressed as follows:

Provided that the number of 12 bits is expressed by a binary number $$n_{12}2^{11} + n_{11}2^{10} + \cdots + n_1 2^0$$

wherein $n_i = 1$ or 0, $i = 1$ to 12) and it is divided by $2^m$ ($m \leq 11$), $$\frac{n_{12}2^{11} + n_{11}2^{10} + \ldots n_1 2^0}{2^m}$$

$$I = n_{12}2^{12-m} + n_{11}2^{11-m} + \cdots + n_0 2^{-m}$$

Provided that m=4, $$I_{(m=4)} = n_{12}2^7 + n_{11}2^6 + \cdots + n_5 2^0 + n_4 2^{-1} + n_3 2^{-2} + n_2 2^{-3} + n_1 2^{-4}$$

That is to say, the adoption of the 8 highest order bits of the counted value integrated by a 12 bit binary counter is equivalent to the omission of the 4 lowest order being below after the division of the original value by $2^4 = 16$.

Figure 4:
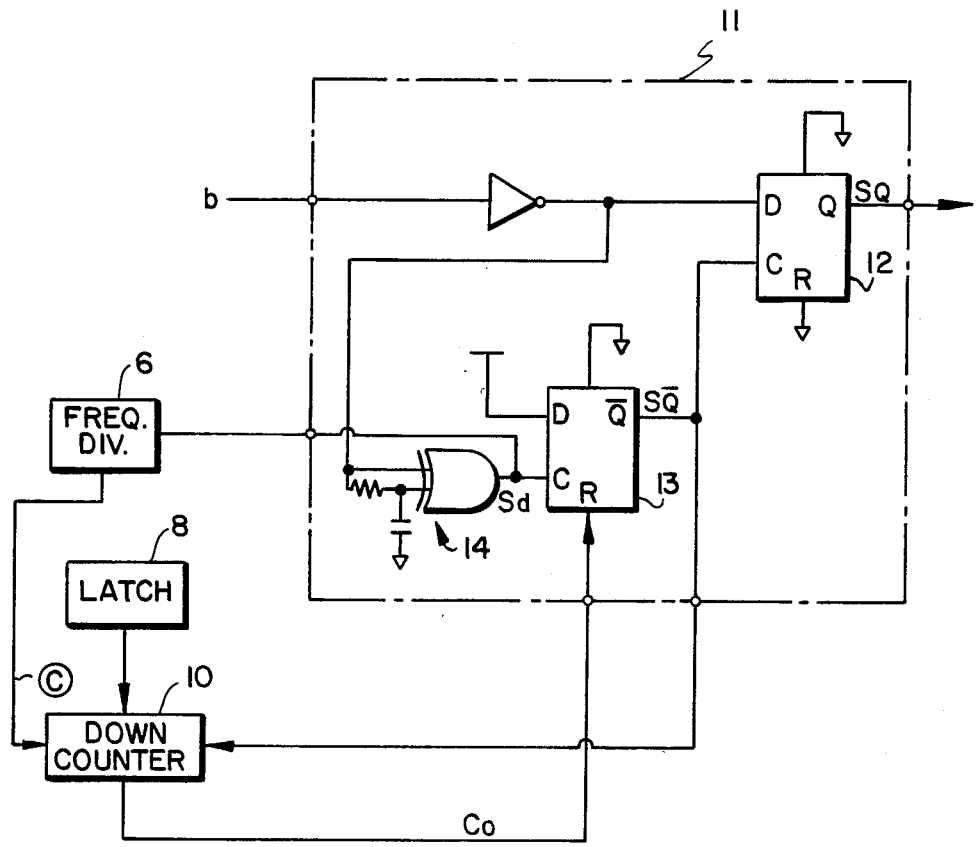
FIG. 4 is a detailed circuit diagram showing a part of the embodiment shown in FIG. 2.
Figure 5:
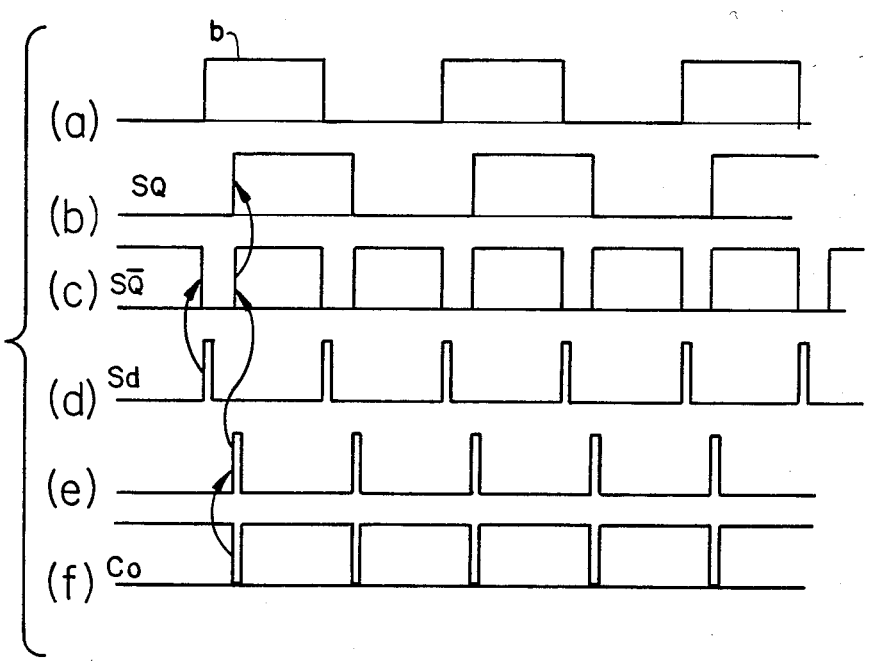
FIG. 5 is a diagram showing wave shapes of each part shown in FIG. 4.

The value latched in said phase shift latch circuit 8 is added to said means 3 for overlapping phases. Said phase shift means 3 consists of a down-counter 10 and a phase shift circuit 11. Said phase shift circuit 11 is mainly composed of two D-latches 12 and 13, as shown in FIG. 4. Said value latched in said latch circuit 8 is added to said down-counter 10 as the preset value, and said clock signals © input added from said frequency divider 6 are down-counted from said preset value. However, the timing of the down-counting is controlled by an output $S_{\bar{Q}}$ of $\bar{Q}$ terminal of the said D-latch 13. Another square wave signal b to be matched in phase to the square wave signal a is applied to the © terminal of said D-latch 13 through a differential circuit 14. Differential signals Sd applied to said C terminal are shown in FIG. 5(d). Said signal $S_{\bar{Q}}$ on said $\bar{Q}$ terminal is changed to a low level, as shown in FIG. 5(c), by the application of said differential signals to said C terminal. Said down-counter 10 starts to down-count from the time when said signal $S_{\bar{Q}}$ is changed to a low level since said signal $S_{\bar{Q}}$ is applied to said down-counter 10 as a start-stop signal. A carry-out signal $C_O$ generated by said down-counter 10 is applied to the R terminal of said D-latch 13 when the counted value in said down-counter 10 reaches 0. As a result, said output $S_{\bar{Q}}$ of said $\bar{Q}$ terminal of said D-latch 13 is returned to a high level so as to stop the counting of said down-counter 10. The value latched in said latch circuit 8 is preset in said down-counter 10 within a time period before the next counter-starting signal is applied by said $S_{\bar{Q}}$ signal. Said down-counter 10 down-counts again when a starting signal is applied and after this, the same actions described above are repeated.

On the other hand, said $S_{\bar{Q}}$ signal is also applied to the C terminal of said D-latch 12 so that an output $S_Q$ of the Q terminal may be switched to a high level or a low level in dependence upon whether said square wave signal b applied to the D terminal of said D-latch is a high level or a low level when said $S_{\bar{Q}}$ signal rises. Consequently, said $S_Q$ signal is behind said square wave signal b by the appointed phases, as shown in FIG. 5(b). Such a phase lag is equivalent to a period from the start of counting by said down-counter 10 to the time when the count-content is set equal to 0 by means of said clock signal © and simultaneously equal to the value counted by means of the same clock signal © and latched in said latch circuit 8. However, as described above, the value latched in said latch circuit 8 is equal to the mean value of the phase shift of said square waves per cycle and thus a phase shift between said square wave signal b and said $S_Q$ signal is equal to said mean value of the phase shift. As a result, said $S_Q$ signal automatically has the same phase as said square wave signal a.

In addition, FIG. 5(e) shows an input to the R terminal of said D-latch 13. In FIG. 2, 15 designates a backup power source for compensating the action of said latch circuit 8 even during power failures and 16 designates a monitor for voltage drops of said backup power source 15 owing to power failures. A signal generated from said synchronous push button 9 is applied to said monitor 16 so that the progress of the synchronization can also be monitored.

Although said push button 9 is pushed by an operator in the above described preferred embodiments, the synchronization may be started by a timer and the like at a suitable timing or by detecting the generation of phase shift between two square wave signals a and b or the excess of the resulting phase shift over an appointed value.

As described above, according to the present invention, the same phase can be automatically given to two square wave signals having different phases. Consequently, the application of the present invention to the circuits, in which for example the same phase is desired for two signals in a synchronous detection circuit and the like, shows an advantage that the characteristics of said circuit exhibit.

What is claimed is:
1. An apparatus for automatically phase-calibrating, said apparatus comprising: a means for detecting phase shifts between two repeated square wave signals havng equal frequency and duty cycles; a means for integrating said detected phase shifts during a predetermined number of cycles of said square wave signals and for calculating the mean value per cycle from said integrated value; a means for shifting a phase of one square wave signal by a phase shift equivalent to said mean value so that a phase of said one square wave signal overlaps a phase of another square wave signal; wherein a means for calculating the mean value per cycle comprises a timing clock connected to a phase shifts-detecting counter for enabling said phase shifts-detecting counter to count phase shifts-detecting signals from said means for detecting phase shifts during said predetermined number of cycles of said repeated square wave signals, a counter for counting clock pulses output from said timing clock only during a period when said phase shifts-detecting signals are counted by said phase shifts-detecting counter, and a latch circuit for latching the value counted by said counter.

2. An apparatus for automatically phase-calibrating, said apparatus comprising: a means for detecting phase shifts between two repeated square wave signals havng equal frequency and duty cycles; a means for integrating said detected phase shifts during a predetermined number of cycles of said square wave signals and for calculating the mean value per cycle from said integrated value; and a means for shifting a phase of one square wave signal by a phase shift equivalent to said mean value so that a phase of said one square wave signal overlaps a phase of another square wave signal; a counter; wherein said means for calculating the mean value per cycle comprises a timing clock connected to a phase shifts-detecting counter for enabling said phase shifts-detecting counter to count phase shifts-detecting signals from said means for detecting phase shifts during said predetermined number of cycles of said repeated square wave signals, a counter for counting clock pulses output from said timing clock only during a period when said phase shifts-detecting signals are counted by said phase shifts-detecting counter, and a latch circuit for latching the counted value counted by said counter, said latch circuit latching only the highest order bits of said counter and not latching the lower N order bits of said counter, wherein $2^N$ is equal to said predetermined number of cycles of said repeated square wave signals.

3. An apparatus for automatically phase-calibrating as claimed in claim 2, wherein 16 cycles are selected for said predetermined number of cycles of said repeated square wave signals, and all but the 4 lowest order bits are latched in said latch circuit.

4. An apparatus for automatically phase-calibrating as claimed in claims 1 or 2, further comprising a pushbutton for controlling the time when said means for calculating the mean value per cycle of said repeated square wave signals is started.

5. An apparatus for automatically phase-calibrating as claimed in claim 1, wherein said means for shifting a phase of said one square wave signal so that it overlaps a phase of another square wave signal comprises a down-counter, in which an output from a latch circuit of said means for calculating the mean value per cycle is applied thereto as the preset value and said clock pulses are subtracted from said preset value and comprising a phase-shifting circuit for controlling the time when said down-counter is started to count synchronously with the times when said repeated square wave signals rise and fall, and for outputting square wave signals which rise or fall at the times when the counted value which is counted by said down-counter reaches 0.

* * * * *